United States Patent [19]

Morgan

[11] 4,352,723

[45] Oct. 5, 1982

[54] METHOD OF CURING A DUAL UV/THERMALLY CURABLE ACRYLATE COMPOSITION

[75] Inventor: Charles R. Morgan, Brookeville, Md.

[73] Assignee: W. R. Grace & Co., New York, N.Y.

[21] Appl. No.: 244,441

[22] Filed: Mar. 16, 1981

Related U.S. Application Data

[62] Division of Ser. No. 177,658, Aug. 13, 1980, Pat. No. 4,288,527.

[51] Int. Cl.$^3$ .............................................. C25F 3/00
[52] U.S. Cl. .......................... 204/159.19; 204/159.23; 204/159.24; 430/300; 430/330; 526/208; 526/210
[58] Field of Search ...................... 204/159.16, 159.23, 204/159.24, 159.19; 430/281, 288, 289, 916, 913, 918, 330, 300; 526/210, 208

[56] References Cited

U.S. PATENT DOCUMENTS

| | | | |
|---|---|---|---|
| 3,313,863 | 4/1967 | Schnell et al. | 526/206 |
| 3,378,533 | 4/1968 | Schnell et al. | 526/208 |
| 4,020,233 | 4/1977 | Morgan | 204/159.23 |
| 4,175,971 | 11/1979 | Shinzaki et al. | 430/288 |

FOREIGN PATENT DOCUMENTS 1041040 9/1966 United Kingdom .

OTHER PUBLICATIONS

Hach's Chemical Dictionary, Third Edition, 1944, p. 660.

Primary Examiner—Jack P. Brammer
Attorney, Agent, or Firm—Richard P. Plunkett; William W. McDowell, Jr.

[57] ABSTRACT

This invention is diected to dual UV and heat activated compositions comprising (1) a liquid, ethylenically unsaturated monomer, oligomer or prepolymer of the formula:

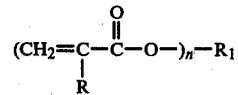

wherein R is H or $CH_3$, $R_1$ is an organic moiety and n is 2 to 4, hereinafter referred to as the ethylenically unsaturated compound, (2) a photoinitiator, and (3) a substituted or unsubstituted pinacol.

The exposure to UV radiation and heat in seriatim or simultaneously results in a cured solid product which can be utilized as coatings, gaskets, sealants, resists and the like.

3 Claims, No Drawings

METHOD OF CURING A DUAL UV/THERMALLY CURABLE ACRYLATE COMPOSITION

This is a division of application Ser. No. 177,658, filed Aug. 13, 1980, now U.S. Pat. No. 4,288,527.

This invention is directed to radiation and heat activated compositions. More particularly, this invention relates to radiation and heat activated compositions comprising liquid di- and polyacrylic terminated monomers, oligomers of prepolymers hereinafter referred to as the ethylenically unsaturated compound in combination with a photoinitiator and a catalytic amount of substituted or unsubstituted pinacol.

BACKGROUND OF THE INVENTION

It is known to carry out interrupted polymerization of compounds which contain polymerizable double bonds by heating said compound with a substituted ethane polymerization catalyst, cooling to interrupt the reaction and, when desired, reheating to continue the polymerization reaction. See U.S. Pat. No. 3,378,533. It is also known from U.S. Pat. No. 3,313,863 to produce molded articles by heating storable masses of unsaturated polyesters with conventional copolymerizable monomeric compounds and a substituted ethane catalyst.

It is further known from British Pat. No. 1,041,040 to prepolymerize unsaturated polyester molding masses to a gel stage by moderate heating in the presence of a substituted ethane polymerization catalyst and in the presence of gellers or activators such as mixtures of amine salts and mercaptans. However, the addition of these monomercaptans with amine salt activators render the masses unstable at ambient or moderate temperatures, thereby greatly reducing shelf life. It is also known from U.S. Pat. No. 4,020,233 to form cured polythioethers by admixing a composition comprising an ethylenically unsaturated compound containing at least two unsaturated carbon-to-carbon bonds per molecule, a polythiol containing at least two thiol groups per molecule, a photoinitiator and a catalytic amount of a pinacol and, thereafter, subjecting the admixture to UV radiation and heat.

One object of the instant invention is to produce a composition which can be dual UV and heat cured. Another object of this invention is to produce cured products by exposing a composition by UV radiation followed by the application of heat. Another object of this invention is to produce cured products by simultaneously UV radiating and heating a curable composition.

OUTLINE OF THE PRESENT INVENTION

The present invention is directed to dual UV and heat activated compositions comprising (1) a liquid monomer, oligomer or prepolymer of the formula:

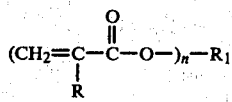

wherein R is H or CH$_3$, R$_1$ is an organic moiety and n is 2 to 4 hereinafter referred to as the ethylenically unsaturated compound, (2) a photoinitiator, and (3) a substituted or unsubstituted pinacol.

The exposure to UV radiation and heat in seriatim or simultaneously results in a cured solid product which can be utilized as coatings, gaskets, sealants, resists and the like.

For certain systems in which UV light cannot penetrate because of geometrical constraints causing shadow areas or in systems rendered partially UV opaque due to fillers, it is desirable to have a system which is dual UV/heat cured. By use of a dual cure, the composition exposed to the UV light can be radiation cured and the part of the composition in the shadow areas can be heat cured. Such dual UV/heat curable systems find utility in sealants and the like.

DETAILED DESCRIPTION OF THE INVENTION

It has now been found that cured products can be obtained from a composition comprising (1) a liquid ethylenically, unsaturated compound of the formula:

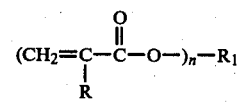

wherein R is H or CH$_3$, R$_1$ is an organic moiety and n is 2 to 4, (2) a photoinitiator, and (3) a substituted or unsubstituted pinacol, by exposing said composition to UV radiation and then heat in seriatim.

Although the aforesaid compositions, per se, are operable herein to form useful products, they may also be used in combination with conventional copolymerizable monomeric compounds or reactive diluents. The admixture of the composition of the instant invention with other monomers is employed usually to control viscosity and other application variables such as rate of cure as well as final film properties such as hardness and flexibility. These reactive diluents cocure with the ethylenically unsaturated compound on exposure to UV radiation and heat. Examples of conventional copolymerizable compounds useful as reactive diluents include, but are not limited to, monofunctional acrylic esters, monofunctional methacrylic esters, styrene, vinyl-toluene, acrylonitrile, methacrylonitrile, vinyl chloride, vinylidene chloride, butadiene, isoprene, chloroprene, divinyl benzene, di(vinyl-phenyl) carbonate, diallyl phthalate, diallyl carbonate, di-(allylphenyl) carbonate, diallyl furmarate, triallyl isocyanurate, triallyl cyanurate, diallyl chlorendate, diallyl maleate and unsaturated polyesters and mixtures thereof. By the term unsaturated polyesters herein is meant the usual polycondensation products which consist of ester-like linked residues of polyvalent, especially divalent, alcohols, as well as possibly also residues of monovalent alcohols and/or of monovalent carboxylic acids, whereby the residues must contain at least partially unsaturated groups. Examples of acids include maleic acid, fumaric acid, itaconic acid, mesaconic acid, citraconic acid, succinic acid, glutaric acid, adipic acid, phthalic acid, tetrachlorophthalic acid, hexachloroendomethylenetetrahydrophthalic acid, trimellitic acid, benzoic acid, linseed oil fatty acid and ricinoleic fatty acid and mixtures thereof. Examples of alcohols include ethylene glycol, diethylene glycol, propane, butane and hexane diols, trimethylolpropane, pentaerythritol, butanol and tetrahydrofurfuryl alcohol.

The reactive diluents can be added to the system in amounts ranging up to 90% by weight of the ethylenically unsaturated compound, preferably 20 to 50% by weight on the same basis.

The substituted or unsubstituted pinacols operable herein as a catalyst have the general formula:

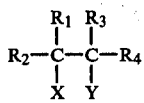

wherein $R_1$ and $R_3$ are the same or different substituted or unsubstituted aromatic radicals, $R_2$ and $R_4$ are substituted or unsubstituted aliphatic or aromatic radicals and X and Y which may be the same or different are hydroxyl, alkoxy or aryloxy.

Preferred pinacols are those wherein $R_1$, $R_2$, $R_3$ and $R_4$ are aromatic radicals, especially phenyl radical and X and Y are hydroxyl.

Examples of this class of compounds include, but are not limited to, benzopinacol, 4,4'-dichlorobenzopinacol, 4,4'-dibromobenzopinacol, 4,4'-diiodobenzopinacol, 4,4',4'',4'''-tetrachlorobenzopinacol, 2,4-2',4'-tetrachlorobenzopinacol, 4,4'-dimethylbenzopinacol, 3,3'-dimethylbenzopinacol, 2,2'-dimethylbenzopinacol, 3,4-3',4'-tetramethylbenzopinacol, 4,4'-dimethoxybenzopinacol, 4,4',4'',4'''-tetramethoxybenzopinacol, 4,4'-diphenylbenzopinacol, 4,4'-dichloro-4'',4'''-dimethylbenzopinacol, 4,4'-dimethyl-4'',4'''-diphenylbenzopinacol, xanthonpinacol, fluorenonepinacol, acetophenonepinacol, 4,4'-dimethylacetophenone-pinacol, 4,4'-dichloroacetophenonepinacol, 1,1,2-triphenyl-propane-1,2-diol, 1,2,3,4-tetraphenylbutane-2,3-diol, 1,2-diphenylcyclobutane-1,2-diol, propiophenone-pinacol, 4,4'-dimethylpropiophenonepinacol, 2,2'-ethyl-3,3'-dimethoxypropiophenone-pinacol, 1,1,1,4,4,4-hexafluoro-2,3-diphenyl-butane-2,3-diol.

As further compounds according to the present invention, there may be mentioned: benzopinacol-mono methylether, benzopinacol-mono-phenylether, benzopinacol and monoisopropyl ether, benzopinacol monoisobutyl ether, benzopinacol mono (diethoxy methyl) ether and the like.

The pinacol is added to the composition in amounts ranging from 0.01–5%, preferably 0.1–3%, by weight based on the weight of the ethylenically unsaturated compound.

The pinacol catalyst can be added to the system in various ways. That is, the pinacol catalyst, per se, can be admixed with the ethylenically unsaturated compound. Additionally, it can be admixed with a photoinitiator and added to the ethylenically unsaturated compound. Furthermore, the pinacol catalyst can be dissolved in well known commercially available solvents such as ketones, e.g., acetone and methylethyl ketone or chlorinated hydrocarbons such as methylene chloride, and then added to the system.

The compositions of the present invention may, if desired, include such additives as antioxidants, dyes, inhibitors, fillers, pigments, antistatic agents, flame-retardant agents, thickeners, thixotropic agents, surface-active agents, viscosity modifiers, extending oils, plasticizers, tackifiers and the like within the scope of this invention. Such additives are usually preblended with the ethylenically unsaturated compound prior to or during the compounding step. Operable fillers include natural and synthetic resins, glass fibers, wood flour, clay, silica, alumina, carbonates, oxides, hydroxides, silicates, glass flakes, borates, phosphates, diatomaceous earth, talc, kaolin, barium sulfate, calcium sulfate, calcium carbonate, antimony oxide and the like. The aforesaid additives may be present in quantities up to 500 parts or more per 100 parts of the ethylenically unsaturated compound by weight and preferably about 0.005 to about 300 parts on the same basis.

In practicing the instant invention the composition is preferably subjected to UV radiation followed by heat activation. Reversing the curing steps is also operational. It preferably is necessary to add known photoinitiators in order to initiate the UV reaction. Preferred photo-initiators are the aldehyde and ketone carbonyl compounds having at least one aromatic nucleous attached directly to the

group. Various photoinitiators include, but are not limited to, benzophenone, acetophenone, o-methoxybenzophenone, acenapthene-quinone, methyl ethyl ketone, valerophenone, hexanophenone, alpha-phenylbutyrophenone, p-morpholinopropionphenone, dibenzosuberone, 4-morpholinobenzophenone, 4'-morpholinodeoxybenzoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthrene-9-one, 7-H-benz[de]anthracen-7-one, 1-naphthaldehyde, 4,4'-bis(dimethylamino)benzophenone, fluorene-9-one, 1'-acetonaphthone, 2'-acetonaphthone, 2,3-butanedione, triphenylphosphine, tri-o-tolyl phosphine, acetonaphthone, 2,3-butanedione, benz[a]anthracene 7.12 dione, etc. Another class of photoinitiators is the benzoin ethers, such as benzoin methyl ether, benzoin ethyl ether, benzoin isopropyl ether and benzoin isobutyl ether. The photoinitiator or mixtures thereof are usually added in an amount ranging from 0.0005 to 30% by weight of the ethylenically unsaturated compound.

A class of actinic light useful herein for curing is ultraviolet light and other forms of actinic radiation which are normally found in radiation emitted from the sun or from artificial sources such as Type RS Sunlamps, carbon arc lamps, xenon arc lamps, mercury vapor lamps, tungsten halide lamps and the like. Ultraviolet radiation may be used most efficiently if the photocurable composition contains a suitable photoinitiator. Curing periods may be adjusted to be very short and hence commercially economical by proper choice of ultraviolet source, photoinitiator, and concentration thereof, temperature and molecular weight and reactive group functionality of the ethylenically unsaturated compound. Curing periods of about 1 second duration are possible, especially in thin film applications such as desired, for example, in coatings, adhesives and photoimaged surfaces.

When UV radiation is used, an intensity of 0.0004 to 60.0 watts/cm² in the 200–400 nanometer region is usually employed.

The heating step requires heating the reactants to at least 50° C., preferably in the range 80°–250° C., in order to form the cured product.

In practicing the instant invention the dual UV/heat curable composition is admixed in any order and applied to the substrate by various conventional means. Following application the composition is exposed to UV radiation for a short period of time, e.g., about 1 second to 1 minute, and, thereafter, exposed to heat by, e.g., passage through a conventional heating oven for a time sufficient to fully cure the composition to a solid product.

The following examples will aid to explain, but specifically not limit, the instant invention. Unless otherwise noted, all parts and percentages are by weight.

EXAMPLE 1

In 40 g of commercially available trimethylolpropane triacrylate was dissolved 0.4 g (1%) benzopinacol and 0.4 g (1%) of commercially available 2,2-dimethoxy-2-phenyl-acetophenone. 20 g of this mixture were poured into an aluminum weighing dish and irradiated for 1 second at a distance of 28 in. by means of an Addalux medium pressure Hg lamp to form a partially cured mixture of solid and liquid phases. The partially cured mixture was then placed in a 105° C. oven for 9 minutes. The resultant product was a solid monolithic section.

The following examples set out in TABLE I show the advantage of using a pinacol in combination with a photoinitiator to cure the ethylenically unsaturated compound. In all examples the ingredients were mixed with no heat and the admixture was placed in an aluminum weighing dish. The formulation was then exposed to UV radiation from an Addalux medium pressure Hg lamp for the given period of time and then placed in a heating oven maintained at 105° C. until the samples were fully cured. For each sample a control run without any pinacol compound being present was carried out. The results are shown in TABLE I.

TABLE I

| Example No. | Composition Ethylenically Unsaturated Compound | Photoinitiator | Pinacol Compound | UV Cure Time (sec) | Remarks after UV Cure | Time in Oven at 105° C. (mins.) | Remarks after Heat Cure |
| --- | --- | --- | --- | --- | --- | --- | --- |
| 2 | 10 g A$^{(1)}$ | 0.1 g DEAP$^{(9)}$ | 0.1 g I$^{(11)}$ | 6.0 | Partial cure | 10 | Fully cured, surface slightly tacky |
| 3 | 10 g A$^{(1)}$ | 0.1 g DEAP$^{(9)}$ | None | 6.0 | Partial cure | 10 | No change from UV cure |
| 4 | 10 g B$^{(2)}$ | 0.1 g DEAP$^{(9)}$ | 0.1 g I$^{(11)}$ | 6.0 | Partial gel | 8 | Fully cured |
| 5 | 10 g B$^{(2)}$ | 0.1 g DEAP$^{(9)}$ | None | 6.0 | Partial gel | 8 | No change from UV cure |
| 6 | 10 g C$^{(3)}$ | 0.1 g DEAP$^{(9)}$ | 0.1 g I$^{(11)}$ | 2.0 | Partial cure | 4 | Fully cured |
| 7 | 10 g C$^{(3)}$ | 0.1 g DEAP$^{(9)}$ | None | 2.0 | Partial cure | 4 | No change from UV cure |
| 8 | 10 g D$^{(4)}$ | 0.1 g DEAP$^{(9)}$ | 0.1 g I$^{(11)}$ | 2.0 | Partial cure | 9.5 | Fully cured |
| 9 | 10 g D$^{(4)}$ | 0.1 g DEAP$^{(9)}$ | None | 2.0 | Partial cure | 9.5 | No change from UV cure |
| 10 | 10 g A$^{(1)}$ | 0.1 g DEAP$^{(9)}$ | 0.1 g J$^{(12)}$ | 6.0 | Partial cure | 24.1 | Fully cured |
| 11 | 10 g A$^{(1)}$ | 0.1 g DEAP$^{(9)}$ | None | 6.0 | Partial cure | 24.1 | No change from UV cure |
| 12 | 10 g E$^{(5)}$ | 0.1 g DEAP$^{(9)}$ | 0.1 g J$^{(12)}$ | 2.0 | Partial cure | 49.0 | Fully cured |
| 13 | 10 g E$^{(5)}$ | 0.1 g DEAP$^{(9)}$ | None | 2.0 | Partial cure | 49.0 | No change from UV cure |
| 14 | 10 g A$^{(1)}$ | 0.1 g H$^{(8)}$ + 0.1 g Vicure 10$^{(10)}$ | 0.1 g I$^{(11)}$ | 2.0 | Partial cure | 20.1 | Fully cured (Oven at 95° C.) |
| 15 | 10 g A$^{(1)}$ | 0.1 g H$^{(8)}$ + 0.1 g Vicure 10$^{(10)}$ | None | 2.0 | Partial cure | 20.1 | No change from UV cure |
| 16 | 10 g E$^{(5)}$ | 0.1 g H$^{(8)}$ + 0.1 g Vicure 10$^{(10)}$ | 0.1 g I$^{(11)}$ | 2.0 | Partial cure | 14.7 | Fully cured (Oven at 95° C.) |
| 17 | 10 g E$^{(5)}$ | 0.1 g H$^{(8)}$ + 0.1 g Vicure 10$^{(10)}$ | None | 2.0 | Partial cure | 14.7 | No change from UV cure |
| 18 | 7.5 g E$^{(5)}$ + 2.5 g F$^{(6)}$ | 0.1 g DEAP$^{(9)}$ | 0.1 g I$^{(11)}$ | 2.0 | Partial cure | 7.3 | Fully cured |
| 19 | 7.5 g E$^{(5)}$ + 2.5 g F$^{(6)}$ | 0.1 g DEAP$^{(9)}$ | None | 2.0 | Partial cure | 7.3 | No change from UV cure |
| 20 | 7.5 g E$^{(5)}$ + 2.5 g G$^{(7)}$ | 0.1 g DEAP$^{(9)}$ | 0.1 g I$^{(11)}$ | 2.0 | Partial cure | 9.3 | Fully cured |
| 21 | 7.5 g E$^{(5)}$ + 2.5 g G$^{(7)}$ | 0.1 g DEAP$^{(9)}$ | None | 2.0 | Partial cure | 9.3 | No change from UV cure |
| 22 | 10 g A$^{(1)}$ | 0.1 g DEAP$^{(9)}$ | 0.1 g K$^{(13)}$ | 8.0 | Partial cure | 8.5 | Fully cured |
| 23 | 10 g A$^{(1)}$ | 0.1 g DEAP$^{(9)}$ | None | 8.0 | Partial cure | 8.5 | No change from UV cure |
| 24 | 10 g E$^{(5)}$ | 0.1 g DEAP$^{(9)}$ | 0.1 g K$^{(13)}$ | 2.0 | Partial cure | 14.5 | Fully cured |
| 25 | 10 g E$^{(5)}$ | 0.1 g DEAP$^{(9)}$ | None | 2.0 | Partial | 14.5 | No change from UV |

TABLE I-continued

| | Composition | | | | | Time in | |
|---|---|---|---|---|---|---|---|
| Example No. | Ethylenically Unsaturated Compound | Photoinitiator | Pinacol Compound | UV Cure Time (sec) | Remarks after UV Cure | Oven at 105° C. (mins.) | Remarks after Heat Cure |
| | | | | | cure | | cure |

[1] A = Trimethylolpropane trimethacrylate
[2] B = Poly(ethylene glycol 400 dimethacrylate)
[3] C = Hexanediol diacrylate
[4] D = Pentaerythritol tetraacrylate
[5] E = Trimethylolpropane triacrylate
[6] F = Diallyl phthalate
[7] G = Triallyl cyanurate
[8] H = Benzophenone
[9] DEAP = 2,2-dimethoxy-2-phenylacetophenone
[10] "Vicure 10" - Benzoin isobutyl ether
[11] I = Benzopinacol
[12] J = 4,4',4'',4'''-tetrafluorobenzopinacol
[13] K = 4,4'-dichlorobenzopinacol

EXAMPLE 26

50 g of commercially available trimethylol propane triacrylate were admixed at room temperature with 0.5 g of 2,2-dimethoxy-2-phenylacetophenone and 0.5 g of benzpinacol. One half of the admixture was placed in an aluminum weighing dish and set on a hot plate for 4 minutes. A partial cure resulted. The partially cured material was then irradiated for 29.5 seconds by means of an Addalux medium pressure Hg ultraviolet lamp. The resultant product was cured to a solid clear-through.

EXAMPLE 27

The other half of the admixture from Example 26 was admixed with 10 g of a silica gel filler, i.e., "Syloid-378", placed in an aluminum weighing dish and exposed for 3 seconds to UV radiation from an Addalux medium pressure Hg lamp. A partial cure resulted. The partially cured mixture was then placed in an oven at 105° C. for 25 minutes. The resultant product was a fully cured solid.

The products resulting from the instant invention have many and varied uses. Examples of some uses include, but are not limited to, adhesives; elastomeric sealants; coatings, liquid castable elastomers; thermoset resins; impregnants for fabric cloth, fibrous webs and other porous substrates; laminated adhesives and coatings, mastics; glazing compounds; fiber glass reinforced composites; sizing or surface finishing agents, filleting compounds, cure in place gasketing compounds; photoresists; printing plates; molded articles and alike. Substrates which can be coated with the composition of the instant invention include, but are not limited to, plastics such as mylar, polyethylene and the like; metals such as copper, aluminum, steel and the like; wood; concrete blocks; brick; vinyl and asbestos floor coverings; ceramics; glass; paper, cardboard and the like.

What is claimed is:

1. The process of forming a cured product which comprises admixing a composition consisting essentially of
   (1) a liquid ethylenically unsaturated compound of the formula:

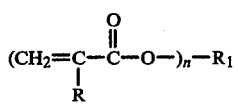

wherein R is H or CH$_3$, R$_1$ is an organic moiety and n is 2 to 4,
   (2) 0.0005 to 30% by weight of (1) of a photoinitiator, and
   (3) 0.01 to 5% by weight of (1) of a substituted or unsubstituted pinacol of the general formula:

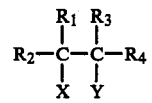

wherein R$_1$ and R$_3$ are members independently selected from the group consisting of substituted and unsubstituted aromatic radicals, R$_2$ and R$_4$ are members independently selected from the group consisting of substituted and unsubstituted aliphatic and aromatic radicals and X and Y are members independently selected from the group consisting of hydroxyl, alkoxy and aryloxy, exposing said composition to UV radiation having an intensity in the range 0.0004 to 60.0 watts/cm$^2$ in the 200–400 nanometer region and, thereafter, heating the composition to a temperature in the range 50°–250° C. for a time sufficient to obtain a cured solid product.

2. The process of forming a cured coating on a substrate which comprises admixing a composition consisting essentially of
   (1) a liquid ethylenically unsaturated compound of the formula:

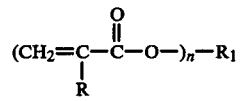

wherein R is H or CH$_3$, R$_1$ is an organic moiety and n is 2 to 4,
   (2) 0.0005 to 30% by weight of (1) of a photoinitiator, and
   (3) 0.01 to 5% by weight of (1) of a substituted or unsubstituted pinacol of the general formula:

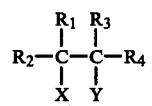

wherein R$_1$ and R$_3$ are members independently selected from the group consisting of substituted and unsubstituted aromatic radicals, $R_2$ and $R_4$ are members independently selected from the group consisting of substituted and unsubstituted aliphatic and aromatic radicals and X and Y are members independently selected from the group consisting of hydroxyl, alkoxy and aryloxy, applying said admixture to a substrate as a coating having a thickness in the range 0.001 to 100 mils, exposing said coating to UV radiation having an intensity in the range 0.0004 to 60.0 watts/cm$^2$ in the 200-400 nanometer region and, thereafter, heating the composition to a temperature in the range 50°-250° C. for a time sufficient to obtain a cured solid product.

3. The process of forming a cured product which comprises admixing a composition consisting essentially of
(1) a liquid ethylenically unsaturated compound of the formula:

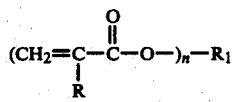

wherein R is H or $CH_3$, $R_1$ is an organic moiety and n is 2 to 4,
(2) 0.0005 to 30% by weight of (1) of a photoinitiator, and
(3) 0.01 to 5% by weight of (1) of a substituted or unsubstituted pinacol of the general formula:

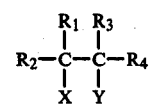

wherein $R_1$ and $R_3$ are members independently selected from the group consisting of substituted and unsubstituted aromatic radicals, $R_2$ and $R_4$ are members independently selected from the group consisting of substituted and unsubstituted aliphatic and aromatic radicals and X and Y are members independently selected from the group consisting of hydroxyl, alkoxy and aryloxy, heating the composition to a temperature in the range 50°-250° C. and thereafter exposing said composition to UV radiation having an intensity in the range 0.0004 to 60.0 watts/cm$^2$ in the 200-400 nanometer region for a time sufficient to obtain a cured solid product.

* * * * *